United States Patent
Xiao et al.

(10) Patent No.: US 9,647,107 B1
(45) Date of Patent: May 9, 2017

(54) FABRICATION METHOD FOR FORMING VERTICAL TRANSISTOR ON HEMISPHERICAL OR POLYGONAL PATTERNED SEMICONDUCTOR SUBSTRATE

(71) Applicant: Zing Semiconductor Corporation, Shanghai (CN)

(72) Inventors: Deyuan Xiao, Shanghai (CN); Richard Chang, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

(21) Appl. No.: 15/003,809

(22) Filed: Jan. 22, 2016

(30) Foreign Application Priority Data

Oct. 26, 2015 (CN) .......................... 2015 1 0703700

(51) Int. Cl.
| | |
|---|---|
| H01L 29/78 | (2006.01) |
| H01L 29/423 | (2006.01) |
| H01L 29/20 | (2006.01) |
| H01L 29/10 | (2006.01) |
| H01L 29/08 | (2006.01) |
| H01L 29/51 | (2006.01) |
| H01L 29/66 | (2006.01) |

(52) U.S. Cl.
CPC ...... H01L 29/7813 (2013.01); H01L 29/0865 (2013.01); H01L 29/0882 (2013.01); H01L 29/1095 (2013.01); H01L 29/2003 (2013.01); H01L 29/4236 (2013.01); H01L 29/42364 (2013.01); H01L 29/512 (2013.01); H01L 29/66522 (2013.01); H01L 29/66734 (2013.01)

(58) Field of Classification Search
CPC ............. H01L 29/7802; H01L 29/0843; H01L 29/4236; H01L 29/42364; H01L 29/66522; H01L 29/66743
See application file for complete search history.

(56) References Cited

U.S. PATENT DOCUMENTS

| | | | | |
|---|---|---|---|---|
| 2013/0234258 A1* | 9/2013 | Sayama | ................... | H01L 29/78 257/394 |
| 2015/0364598 A1* | 12/2015 | Jung | .................... | H01L 29/0653 257/343 |
| 2016/0247681 A1* | 8/2016 | Ikeda | .................. | H01L 21/0455 |

* cited by examiner

*Primary Examiner* — Thanh V Pham
(74) *Attorney, Agent, or Firm* — Kilpatrick Townsend & Stockton LLP (57) ABSTRACT

A vertical transistor and the fabrication method. The transistor comprises a first surface and a second surface that is opposite to the first surface. A drift region of the first doping type, this drift region is located between the first surface and the second surface; at least one source region of the first doping type and the source region being located between the drift region and the first surface, with a first dielectric layer located between adjacent source regions; at least one drain region with said first doping type and said drain region being located between said drift region and said second surface, a gate being provided between adjacent drain regions. Said gate includes a gate electrode and a gate dielectric layer disposed between said gate electrode and said drift region, and the second dielectric layer being positioned between said gate electrode and said second surface.

4 Claims, 8 Drawing Sheets

FABRICATION METHOD FOR FORMING VERTICAL TRANSISTOR ON HEMISPHERICAL OR POLYGONAL PATTERNED SEMICONDUCTOR SUBSTRATE

The present application claims the priority to Chinese Patent Applications No. 201510703700.1, filed with the Chinese State Intellectual Property Office on Oct. 26, 2015, which is incorporated herein by reference in its entirety.

BACKGROUND

As a typical representative of third-generation semiconductor materials, wide-band gap semiconductors, including GaN, possess a plurality of outstanding performances capabilities which silicon (Si) materials lack. GaN is an excellent semiconductor material for high-frequency, high-voltage, high-temperature, and high-power applications, with great prospects for application in civil and military fields. Due to advances in GaN technology, especially the gradual maturity and commercialization of large-diameter silicon-based GaN epitaxial technology, the technology of GaN power semiconductors is expected to be a technical solution of high-performance and low success rate. Thus the GaN power devices have drawn the attention of famous international semiconductor manufacturers and research institutes.

SUMMARY

The present invention aims to provide a vertical transistor and its fabrication method. The vertical transistor is a GaN junction-less power transistor, reducing the power consumption of the transistor.

To solve the above technical problem, the present invention is a vertical transistor, comprising: a first surface and a second surface opposite to said first surface; a drift region of the first doping type and said drift region being located between said first surface and the second surface; at least one source region of said first doping type and the source region being located between said drift region and said first surface, with a first dielectric layer located between adjacent source regions; at least one drain region with said first doping type and said drain region being located between said drift region and said second surface, with a gate provided between adjacent drain regions. Said gate includes a gate electrode and a gate dielectric layer located between said gate electrode and said drift region, a second dielectric layer being positioned between said gate electrode and said second surface.

Optionally, it also includes the source electrode on said first surface and the drain electrode on said second surface.

Optionally, said first doping type is N-type.

Optionally, the drift region is N-type doped GaN, with a thickness of 2-50 μm.

Optionally, the source region is the heavily doped N-type GaN and said drain region is heavily doped N-type GaN.

Optionally, the gate electrode is one of Ti, TiN, Ta, TaN, W, Al, Cu, Ag, Ni, Au, Cr and polycrystalline silicon.

Optionally, the gate dielectric layer is silicon oxide and said silicon oxide is 2-50 nm thick.

Optionally, the first dielectric layer is one of silicon oxide, SiON or GaN. Said first dielectric layer is 20-100 nm thick.

Optionally, the second dielectric layer is one of silicon oxide, SiON or GaN. Said second dielectric layer is 20-100 nm thick.

Accordingly, the present invention also provides a method for preparing a vertical transistor comprising: providing a patterned semiconductor substrate; forming a first dielectric layer on one portion of the patterned semiconductor substrate and forming a source region on the remaining portion of patterned semiconductor substrate, said source region having the first doping type; forming a drift layer and the drain region film layer, the drift layer covering the first dielectric layer and the drain region, said drain region film layer overlaying said drift layer, said drift layer and drain region film layer having the first doping type; etching said drain region film layer and said drift layer to form a trench, the trench exposing the drift layer, the remaining drift layer forming the drift region, the remaining drain region film layer forming a drain region; forming the gate dielectric layer and the gate electrode, the gate dielectric layer overlaying the bottom and side walls of the trench, said gate electrode overlaying the gate dielectric layer and filling some portions of said trench; forming the second dielectric layer, said second dielectric layer overlaying said gate electrode, and filling the remaining portion of the trench.

Optionally, the steps to form said gate dielectric layer and gate electrode comprise: forming a dielectric layer and an electrode film layer, the dielectric layer covering the bottom and side walls of the trench and the drain region, said electrode film layer overlaying said dielectric film layer; planarizing the electrode film layer, the electrode layer is set flush with the dielectric film layer; etching said dielectric film layer to form a gate dielectric layer, said gate dielectric layer exposing said drain region; removing some portions of the electrode film layer to form the gate electrode.

Optionally, they further comprise forming a drain electrode, the drain electrode overlaying the second dielectric layer, said gate dielectric layer and said drain region; removing the patterned semiconductor substrate; forming a source electrode, said source electrode overlaying the first dielectric layer and the source region.

Optionally, the surface of the patterned semiconductor substrate is provided with a hemispherical or polygonal pattern.

The present invention provides a vertical transistor comprising a source region, a drift region, a drain region and a gate electrode, wherein the source region, the drain region and the drift region have the first doping type, so that the transistor is a junction-less transistor, thereby reducing power consumption of the transistor. Moreover, the voltage applied to the gate is used to control the passage of carriers in the drift region into the depletion region between gates, so as control the switch of transistor.

DETAILED DESCRIPTION

The vertical transistor and its fabrication method are described in more detail in conjunction with schematic views as follows. Wherein the preferred embodiment of the present invention is illustrated, it should be understood that those skilled in the art may modify the invention and may still realize the advantageous effects of the invention. Thus, the following description should be understood to be widely known by the skills in the art and should not be regarded as a limitation of the present invention.

The core idea of the present invention is to provide a vertical transistor, comprising: a first surface and a second surface opposite to the first surface; a drift region with the first doping type, said drift region is located between said first surface and the second surface; at least one source region with said first doping type and the source region is located between said drift region and said first surface, with the first dielectric layer located between adjacent source regions; at least one drain region with said first doping type and said drain region is located between said drift region and said second surface, with a gate provided between adjacent drain regions. Said gate includes a gate electrode and a gate dielectric layer located between said gate electrode and said drift region, the second dielectric layer is positioned between said gate electrode and said second surface. In the present invention, the source region, drain region and drift region all have the first doping type so that the transistor is the junction-less power transistor, thereby reducing the power consumption of the transistor.

The vertical transistor and its fabrication method in the present invention are described with reference to the drawings below.

Figure 1:
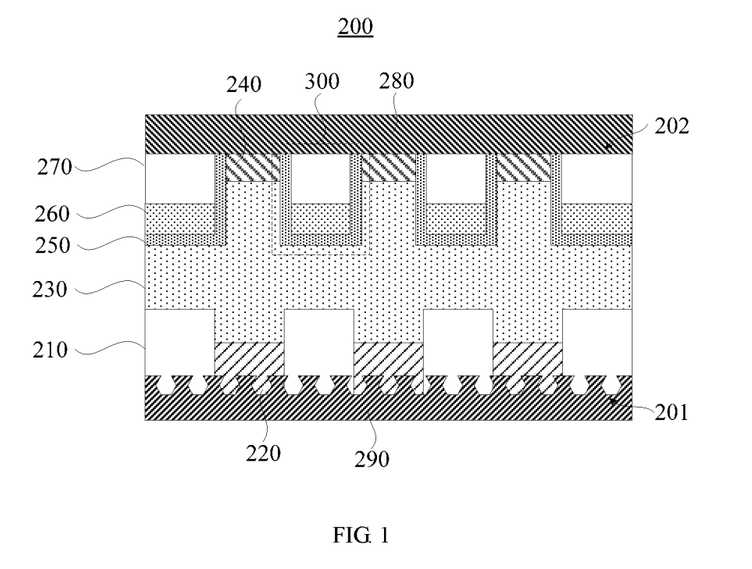
FIG. 1 illustrates a schematic diagram of cross-sectional structural view of the vertical transistor in an embodiment of present invention.

Referring to FIG. 1, FIG. 1 illustrates the cross-sectional and schematic diagram of a vertical transistor 200 which comprises: a first surface 201 and a second surface 202, opposite to the first surface 201; a drift region 230, located between said first surface 201 and second surface 202, the drift region 230 being first N-type doping type. For example, the drift region 230 being N-type doped GaN. The thickness of the drift region 230 is 2 μm-50 μm; at least one source region 220 being located between the drift region 230 and the first surface 201, the source region 220 being first doping type, and the source region 220 being heavily doped N-type GaN. The thickness of the source region 220 is 10-50 nm. The first dielectric layer 210 is disposed between the adjacent source regions 220. The first dielectric layer 210 is employed to isolate the source region 220. The first dielectric layer 210 is one of silicon oxide, SiON, or GaN. The thickness of first dielectric layer 210 is 20-100 nm; at least one drain region 240 is located between the drift region 230 and the second surface 202, the drain region 240 being said first doping type. The drain region 240 is heavily doped N-type GaN. The thickness of the drain region 240 is 10-50 nm. A gate 300 is disposed between adjacent drain regions 240. The gate 300 includes a gate electrode 260 and a gate dielectric layer 250 located between the gate electrode 260 and said drift region 230, the gate dielectric layer 250 being silicon oxide and 2-50 nm thick, said gate dielectric layer 260 is one of Ti, TiN, Ta, TaN, W, Al, Cu, Ag, Ni, Au, Cr, or polycrystalline silicon. In addition, a second dielectric layer 270 is disposed between the gate electrode 260 and the second surface 202. The second dielectric layer 270 is employed to realize the electrical insulation between the gate electrode 260 and the drain electrode, said second dielectric layer 270 being of silicon oxide, SiON, or GaN. The thickness of the second dielectric layer 270 is 20-100 nm.

In addition, the vertical transistor further comprises a source electrode 290 on the first surface 201 and a drain electrode 280 on the second surface 202. The source electrode 290 is of Ti, Ni, Al, or Au. The thickness of the source electrode 290 is 50-200 nm. The drain electrode 280 is of Ti, Ni, Al, or Au. The thickness of the drain electrode 280 is 50-200 nm.

Figure 2:
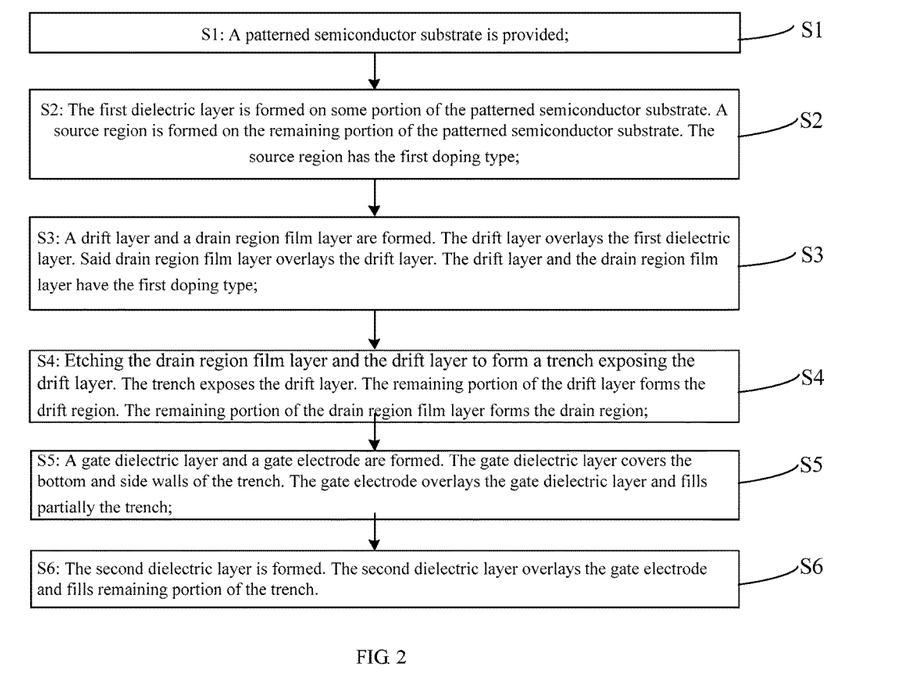
FIG. 2 illustrates a flowchart of the method to prepare a vertical transistor in an embodiment of present invention.
Figure 3:
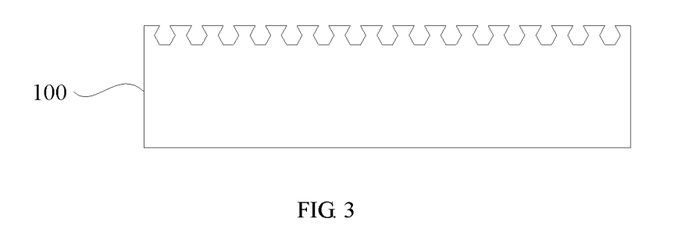
FIG. 3 illustrates a schematic diagram of the cross-sectional structural view of the patterned semiconductor substrate in an embodiment of present invention.

Accordingly, the present invention also provides a method for preparing a vertical transistor. FIG. 2 is a flow chart for preparing the vertical transistor. FIG. 3 to FIG. 12 illustrate the schematic and structural view of all steps. The fabrication process comprises following steps:

Step S1 is implemented with reference to FIG. 3. A patterned semiconductor substrate 100 is provided. The surface of the patterned semiconductor substrate 100 has a hemispherical or polygonal pattern. In the present embodiment, the pattern array is formed on the semiconductor substrate with planar surfaces. For example, an array of polystyrene beads is attached using a patterned array as a mask to etch the semiconductor substrate and form the patterned semiconductor substrate. In the present embodiment, the semiconductor substrate 100 may be a silicon substrate, a germanium substrate, or an SiGe substrate. A silicon substrate is preferred. It is appreciated that, due to the lattice mismatch between the IV materials and III-V compounds, the formation of III-V compounds on the patterned semiconductor substrate will lead to defects. However, the pattern formed on the surface of semiconductor substrate may reduce the defect caused by lattice mismatch.

Figure 4:
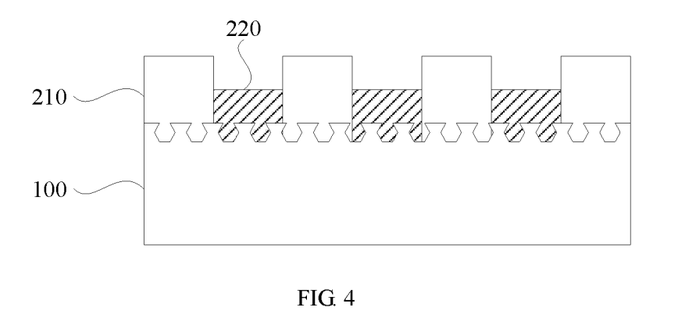
FIG. 4 illustrates a schematic diagram of the cross-sectional structural view of the first dielectric layer and the source region in an embodiment of present invention.

Step S2 is implemented with reference to FIG. 4. A first dielectric layer 210 is formed on some portion of the patterned semiconductor substrate 100 and a source region 220 is formed on the remaining portion of the patterned semiconductor substrate 100. In the present embodiment, the source region 220 has the first doping type, e.g., the source region 220 is heavily doped N-type GaN. The first dielectric layer 210 is silicon oxide, SiON, or GaN. The first dielectric layer 210 is used to isolate the source region 220.

Figure 5:
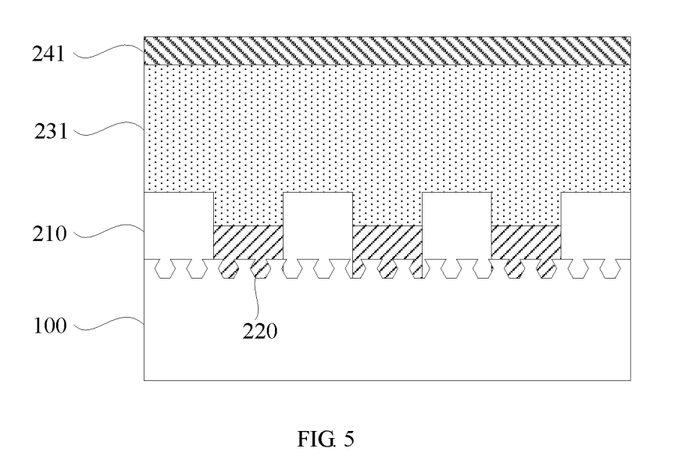
FIG. 5 illustrates a schematic structural diagram of forming the drift layer and the drain region film layer in an embodiment of present invention.

Step S3 is implemented with reference to FIG. 5. A drift layer 231 and a drain region film layer 241 are formed. The drift layer 231 overlays the first dielectric layer 210 and the source region 220. Said drain region film layer 241 overlays the drift layer 231. In this embodiment, the drift layer 231 has the first doping type and is heavily doped N-type GaN. The thickness of the drift layer 231 is 2 μm~50 μm. The drain region film layer 241 has the first doping type and is heavily doped N-type GaN.

Figure 6:
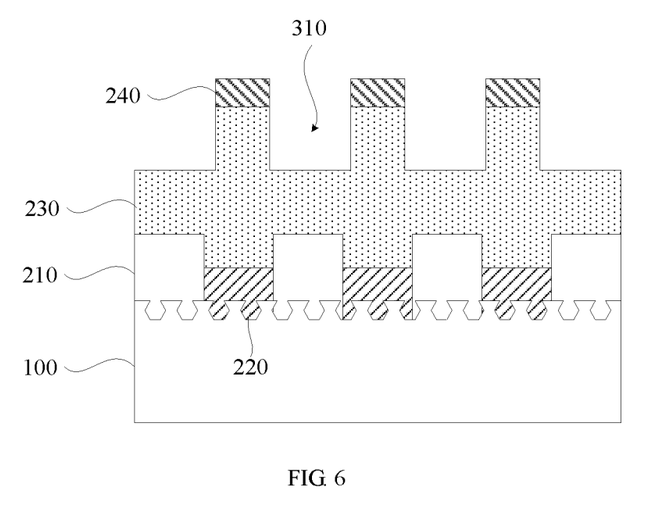
FIG. 6 illustrates a schematic and structural diagram of the trench in an embodiment of present invention.

Step S4 is implemented with reference to FIG. 6. The drain region film layer 241 is etched and the drift layer 231 forms a trench 310. The trench 310 exposes the drift layer 241. The remaining portion of the drift layer 231 forms the drift region 230. The remaining portion of the drain region film layer 241 forms the drain region 240.

Figure 7:
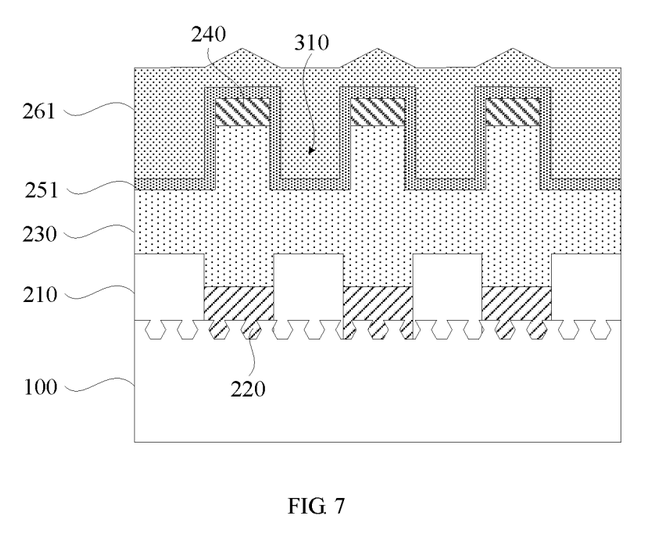
FIG. 7 illustrates a schematic and structural diagram of forming the film dielectric film layer and the electrode film layer in an embodiment of present invention.
Figure 8:
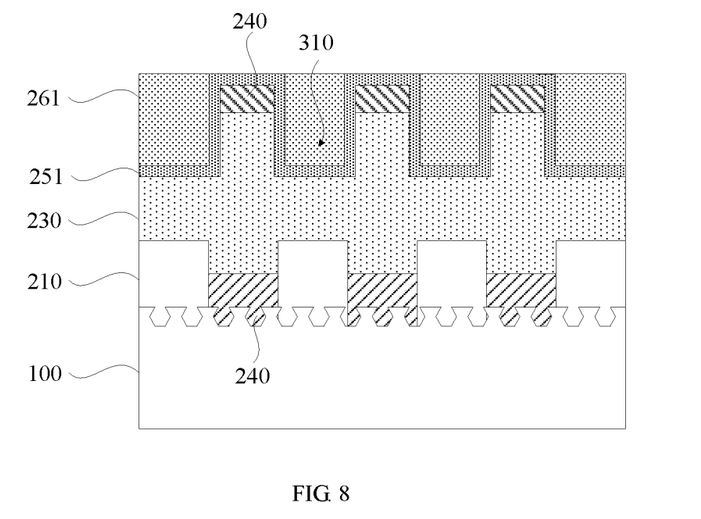
FIG. 8 illustrates a schematic and structural diagram of planarizing the electrode film layer in an embodiment of present invention.
Figure 9:
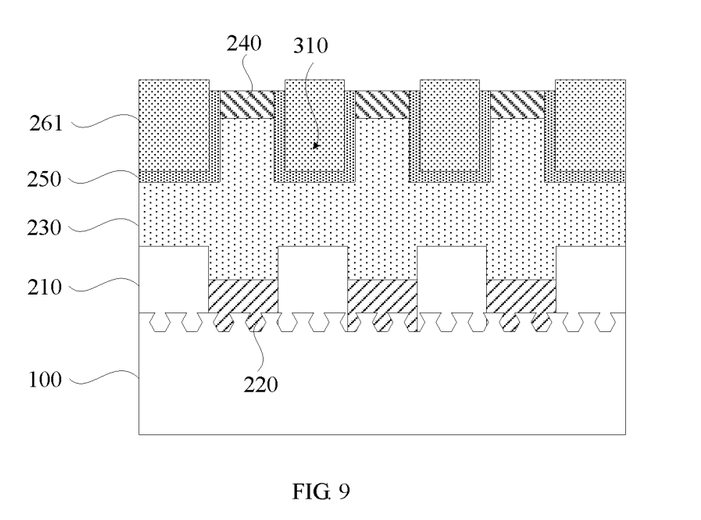
FIG. 9 illustrates a schematic and structural diagram of forming the gate dielectric layer in an embodiment of present invention.
Figure 10:
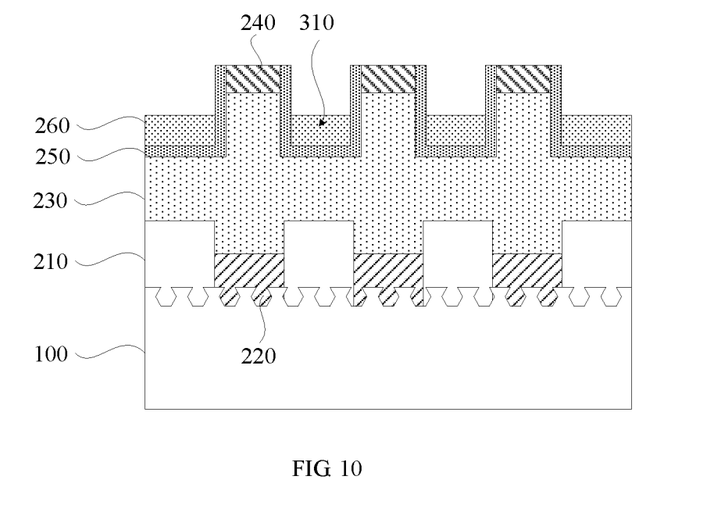
FIG. 10 illustrates a schematic and structural diagram of forming the gate electrode in an embodiment of present invention.

Step S5 is implemented with reference to FIG. 7 to FIG. 10. A gate dielectric layer 250 and a gate electrode 260 are formed. The gate dielectric layer 250 covers the bottom and side walls of the trench 310. The gate dielectric layer 260 overlays the gate dielectric layer 250 and fills partially the trench 310. In this embodiment, steps to form the gate dielectric layer 250 and the gate electrode 260 specifically comprise:

With reference to FIG. 7, a dielectric film layer 251 and an electrode film layer 261 are formed. The dielectric film layer 251 covers the bottom and side walls of the trench 310 as well as the drain region 240. The electrode film layer 261 covers the dielectric film layer 251;

With reference to FIG. 8, the dielectric film layer 261 is planarized so that it is flush with the dielectric layer 251;

With reference to FIG. 9, the dielectric film layer 251 is etched. The remaining portion of dielectric film layer 251 forms the gate dielectric layer 250. The gate dielectric layer 250 exposes said drain region 240;

With reference to FIG. 10, the electrode layer 261 is etched. Some portion of the electrode film layer 261 is removed. The remaining portion of the electrode film layer 261 forms the gate electrode 260. Therefore the gate dielectric layer 160 and the gate electrode 250 together form the gate 300 of the vertical transistor.

Figure 11:
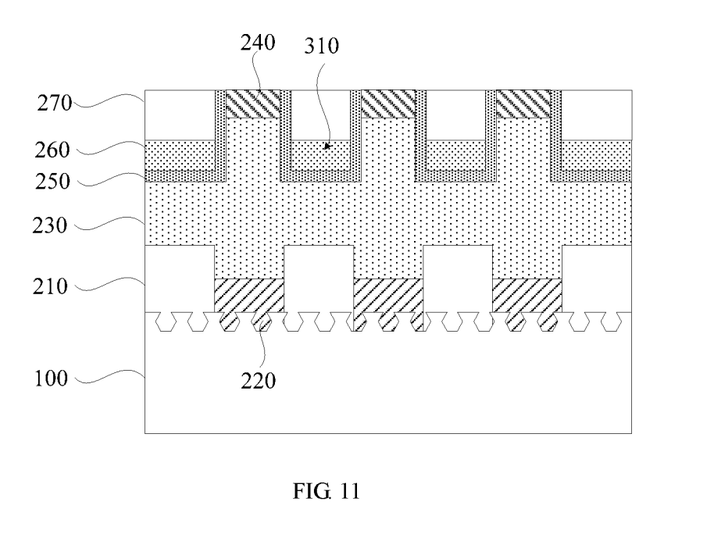
FIG. 11 illustrates a schematic and structural diagram of forming the second dielectric layer in an embodiment of present invention.

The step S6 is implemented with reference to FIG. 11. The second dielectric layer 270 is formed. Said dielectric layer 270 overlays the gate electrode 260. Said dielectric layer 270 is used to isolate the gate electrode 250 from the drain electrode.

Figure 12:
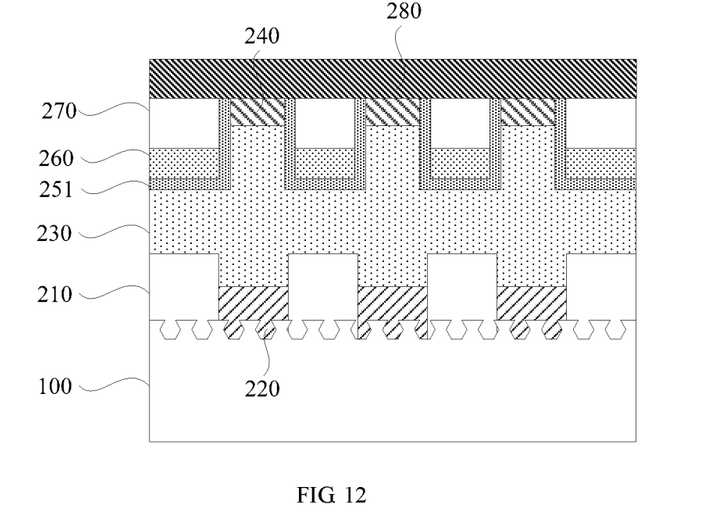
FIG. 12 illustrates a schematic and structural diagram of forming the drain electrode in an embodiment of present invention.

With reference to FIG. 12, the fabrication method of a vertical transistor further comprises: forming a drain electrode 280, the drain electrode 280 overlaying the second dielectric layer 270, the gate dielectric layer 250, and the drain region 240; removing the patterned semiconductor substrate 100; forming a source electrode 290, the source electrode 290 covering the first dielectric layer 210 and the source region 220, thereby forming the vertical transistor 200 as shown in FIG. 1. Wherein the first dielectric layer 210 and the source region 220 together form the first surface 201 of the vertical transistor; the second dielectric layer 270, the gate dielectric layer 260, and the drain region 240 together form the second surface of the vertical transistor; the first surface 201 being prepared on the patterned semiconductor substrate 100. The first surface 201 is of planar structure. However, those skilled in the art will be able to appreciate that, after the removal of the patterned semiconductor substrate 100, chemical and mechanical polishing is conducted to form the planar first surface, and thereafter form the source electrodes on the first surface and lead out the source region.

The source region 220, the drift region 230, and drain region 240 in the vertical transistor of the present invention all have the first doping type and are N-type doped GaN. As a junction-less power transistor, it can be used to reduce power consumption. Furthermore, due to the contact of metal-oxide-semiconductor formed between the gate electrode 260 and the drift region 230 as well as the work function difference between GaN and the metal, a depletion region is formed between the gate dielectric layers 250. When the depletion region runs through the region between the gate dielectric layers 250, carriers fail to pass through them. However the application of a voltage on the gate enables carriers to pass through regions between the gate dielectric layers 250. The voltage is Vt, the threshold voltage of the vertical transistor, so that the vertical transistor of the present invention can control the switch of transistor through controlling the voltage value on the gate.

Figure 13:
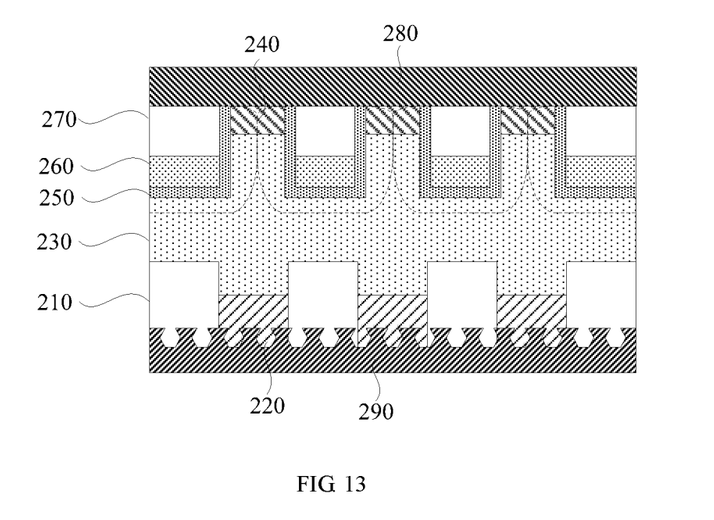
FIG. 13 illustrates a schematic and structural diagram of turning off the vertical transistor in an embodiment of present invention.
Figure 14:
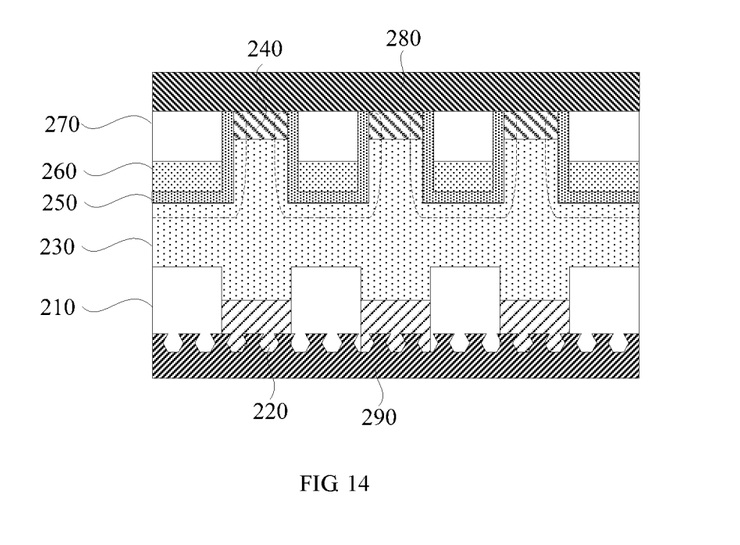
FIG. 14 illustrates a schematic and structural diagram of turning on the vertical transistor in an embodiment of present invention.

When reference to FIG. 13, when the gate electrode 260 is free of voltage Vg or is applied with a voltage Vg less than Vt, the threshold voltage of the vertical transistor, after the application of voltage on the source electrode 290, carriers are developed in the source region 220. The carriers pass from the source region 220 through the drift region 230 to the drain region 240. Carriers will be completely depleted in the region (region of the dotted line in FIG. 13) between the gate dielectric layers 250, so that the vertical transistor is turned off. With reference to FIG. 14, after the application of a voltage Vg greater than Vt, the threshold voltage to turn on the vertical transistor, the depletion region of carriers (region of the dotted line in FIG. 14) is reduced so that carriers may pass through regions between the gate dielectric layers 250 and reach the drain region 240 to turn on the vertical transistor.

In summary, the vertical transistor of the present invention includes a drift region, a source region, a drain region, and a gate. The drift region, the source region, and the drain region are of the first doping type, so that the vertical transistor is a junction-less transistor, reducing the power consumption of the transistor.

Obviously, those skilled in the art may make various modifications and variations of the present invention without departing from the spirit and scope of the invention. Thus, if such modifications and variations of the present invention fall in the claims of the invention and within the scope of equivalents technology, the present invention is also intended to encompass such changes and variations.

What is claimed is:

1. A method for processing a vertical transistor comprising:
   forming a hemispherical or polygonal patterned semiconductor substrate;
   developing a first dielectric layer on some portions of the patterned semiconductor substrate, and forming a source region on a remaining portion of the patterned semiconductor substrate, the source region having a first doping type;
   forming a drift layer and a drain region film layer, the drift layer covering the first dielectric layer, the drain region film layer covering the drift layer, the drift layer and the drain region film layer comprising the first doping type;
   etching the drain region film layer and the drift layer to form a trench exposing the drift layer, the remaining drift layer forming a drift region, the remaining portion of the drain region film layer forming the drain region;
   forming a gate dielectric layer and a gate electrode, the gate dielectric layer covering the bottom and side walls of the trench, the gate electrode overlaying the gate dielectric layer and partially filling the trench;

forming a second dielectric layer, the second dielectric layer covering the gate electrode, and filling said trench of the remaining portion of the trench.

2. The method claim 1 further comprising:

forming a dielectric film layer and an electrode film layer, the dielectric film layer covering the bottom and side walls of the trench and the drain region, the electrode film layer covering the dielectric film layer;

planarizing the electrode film layer, so that the electrode film layer is flush with the dielectric film layer;

etching the dielectric film layer to develop a gate dielectric layer, the gate dielectric layer exposing the drain region;

removing partially the electrode film layer to develop the gate electrode.

3. The method of claim 1 further comprising:

forming a drain electrode, the drain electrode overlaying the second dielectric layer, the gate dielectric layer and the drain region;

removing the patterned semiconductor substrate; forming the source electrode and said source electrode overlaying the first dielectric layer and the source region.

4. The method of claim 1 wherein the substrate is silicon.

* * * * *